(12) United States Patent
Bandic et al.

(10) Patent No.: US 10,459,793 B2
(45) Date of Patent: Oct. 29, 2019

(54) DATA RELIABILITY INFORMATION IN A NON-VOLATILE MEMORY DEVICE

(71) Applicant: Western Digital Technologies, Inc., Irvine, CA (US)

(72) Inventors: Zvonimir Z. Bandic, San Jose, CA (US); Kiran Kumar Gunnam, Milpitas, CA (US); Seung-Hwan Song, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 139 days.

(21) Appl. No.: 15/073,409

(22) Filed: Mar. 17, 2016

(65) Prior Publication Data

US 2017/0269992 A1 Sep. 21, 2017

(51) Int. Cl.
*G11C 29/00* (2006.01)
*G06F 11/10* (2006.01)
*G11C 29/52* (2006.01)

(52) U.S. Cl.
CPC ........ *G06F 11/108* (2013.01); *G06F 11/1048* (2013.01); *G11C 29/52* (2013.01)

(58) Field of Classification Search
CPC .... G06F 11/1068; G06F 3/0619; G06F 3/064; G06F 3/0688; G06F 3/0689; G06F 11/1048; G06F 11/108; G11C 29/52; G11C 29/0411
USPC ....... 714/764, 765, 766, 767, 799, 800, 801, 714/802
See application file for complete search history.

(56) References Cited

U.S. PATENT DOCUMENTS

| | | | |
|---|---|---|---|
| 8,498,152 B2 * | 7/2013 | Alrod | G06F 11/1072 365/185.01 |
| 8,578,244 B2 | 11/2013 | Roohparvar et al. | |
| 8,621,328 B2 | 12/2013 | Franceschini et al. | |
| 8,700,951 B1 | 4/2014 | Call et al. | |
| 8,726,126 B2 | 5/2014 | Post | |
| 8,745,328 B2 | 6/2014 | Cornwell et al. | |
| 9,021,339 B2 | 4/2015 | Lu et al. | |
| 2012/0084490 A1 * | 4/2012 | Choi | G11C 16/02 711/103 |
| 2014/0101371 A1 | 4/2014 | Nguyen et al. | |
| 2014/0229655 A1 | 8/2014 | Goss et al. | |
| 2014/0281762 A1 * | 9/2014 | Norrie | G06F 11/2215 714/703 |

* cited by examiner

*Primary Examiner* — Christine T. Tu
(74) *Attorney, Agent, or Firm* — Patterson & Sheridan, LLP; Steven H. Versteeg (57) ABSTRACT

A data storage device may include a non-volatile memory array and a controller. The non-volatile memory array may include a plurality of dies. Each die of the plurality of data dies may include a plurality of words, where a word is an access unit of a die. The controller may be configured to store user data to a respective first word of at least a first die and a second die of the plurality of data dies. A page of user data may include the user data stored at the respective first words of the at least first die and second die. The controller may also be configured to store parity data to a first portion of a first word of a third die. The controller may be further configured to store metadata to a second portion of the first word of the third die.

17 Claims, 7 Drawing Sheets

DATA RELIABILITY INFORMATION IN A NON-VOLATILE MEMORY DEVICE

TECHNICAL FIELD

This disclosure relates to memory management.

BACKGROUND

Memory devices used in computers or other electronics devices may be non-volatile memory or volatile memory. The main difference between non-volatile memory and volatile memory is that non-volatile memory may continue to store data without requiring a persistent power supply. Non-volatile memory devices, including flash memory devices, are commonly incorporated into solid-state storage devices, such as solid-state drives (SSDs).

In some examples, when writing data to the non-volatile memory devices, a controller may perform one or more operations to protect the data from memory errors. For instance, in addition to writing the data to the non-volatile memory devices, a controller may generate and write parity data to the memory device that may be used to recover the data, such as in the event of a memory error.

SUMMARY

In one example, a data storage device may include a non-volatile memory array and a controller. The non-volatile memory array may include a plurality of dies. Each die of the plurality of dies may include a plurality of words, where a word is an access unit of a die. The controller may be configured to store user data to a respective first word of at least a first die and a second die of the plurality of dies. A page of user data may include user data stored at the respective first words of the at least first die and second die. The controller may also be configured to store parity data to a first portion of a first word of a third die of the plurality of dies. The controller may be further configured to store metadata to a second portion of the first word of the third die.

In one example, a method includes storing, by a controller, user data to a respective first word of at least a first die and a second die of a plurality of dies of a non-volatile memory array. Each die of the plurality of dies includes a plurality of words, and a word is an access unit of a die. A page of user data may include user data stored at the respective first words of the at least first die and second die. The method may also include storing, by the controller, parity data to a first portion of a first word of a third die of the plurality of dies. The method may further include storing metadata to a second portion of the first word of the third die.

In another example, a computer-readable storage medium may store instructions that, when executed, cause a controller of a data storage device to store user data to a respective first word of at least a first die and a second die of a plurality of dies of a non-volatile memory array. Each die of the plurality of dies includes a plurality of words, and a word is an access unit of a die. A page of user data may include user data stored at the respective first words of the at least first die and second die. The computer-readable storage medium may also store instructions that cause the controller to store parity data to a first portion of a first word of a third die of the plurality of dies, and store metadata to a second portion of the first word of the third die.

The details of one or more examples are set forth in the accompanying drawings and the description below. Other features, objects, and advantages will be apparent from the description and drawings, and from the claims.

DETAILED DESCRIPTION

In general, this disclosure describes techniques for improving the reliability of user data stored in a storage device, such as a solid state drive (SSD). A storage device may include a plurality of memory devices that may be divided into a plurality of pages. A page may be divided into a plurality of words, each word including memory cells that store data. In some examples, the words of a particular page may be physically located on different memory devices. In some examples, a controller in the storage device may be configured to store user data to a first subset of the plurality of memory devices and store parity data to a second subset of the plurality of memory devices. Further, the controller may be configured to store metadata to the second subset of memory devices. The metadata may include information about the reliability of the user data stored on the first subset of memory devices. By storing information about the reliability of the user data stored at the first subset of memory devices to the second subset of memory devices, the controller may improve error detection and correction of the user data. For example, where a word of the second subset of memory devices includes 128 bits and the parity data occupies only 110 bits of the 128 bits, the word of the second subset of memory devices may include 18 unused bits. Rather that leaving these bits unused, the controller may store metadata, such as data reliability information, in at least a portion of the unused bits.

In some examples, a controller in the storage device may be configured to store user data and parity data to each of the plurality of memory devices. Further, the controller may be configured to store metadata to at least one of the memory devices. The metadata may include information about the reliability of the user and parity data stored on the memory devices. By storing information about the reliability of the user data and parity data stored at the memory devices, the controller may improve error detection and correction of the user and parity data. For example, where a word of the memory devices includes 128 bits and the combined user data and parity data occupies only 110 bits of the 128 bits, the word of the memory device may include 18 unused bits. Rather that leaving these bits unused, the controller may store metadata, such as data reliability information, in at least a portion of the unused bits.

By storing data reliability information to the otherwise unused bits of the memory devices, techniques of this disclosure may enable the controller to increase the reliability of the user or combined user data and parity data stored on the memory devices.

Figure 1:
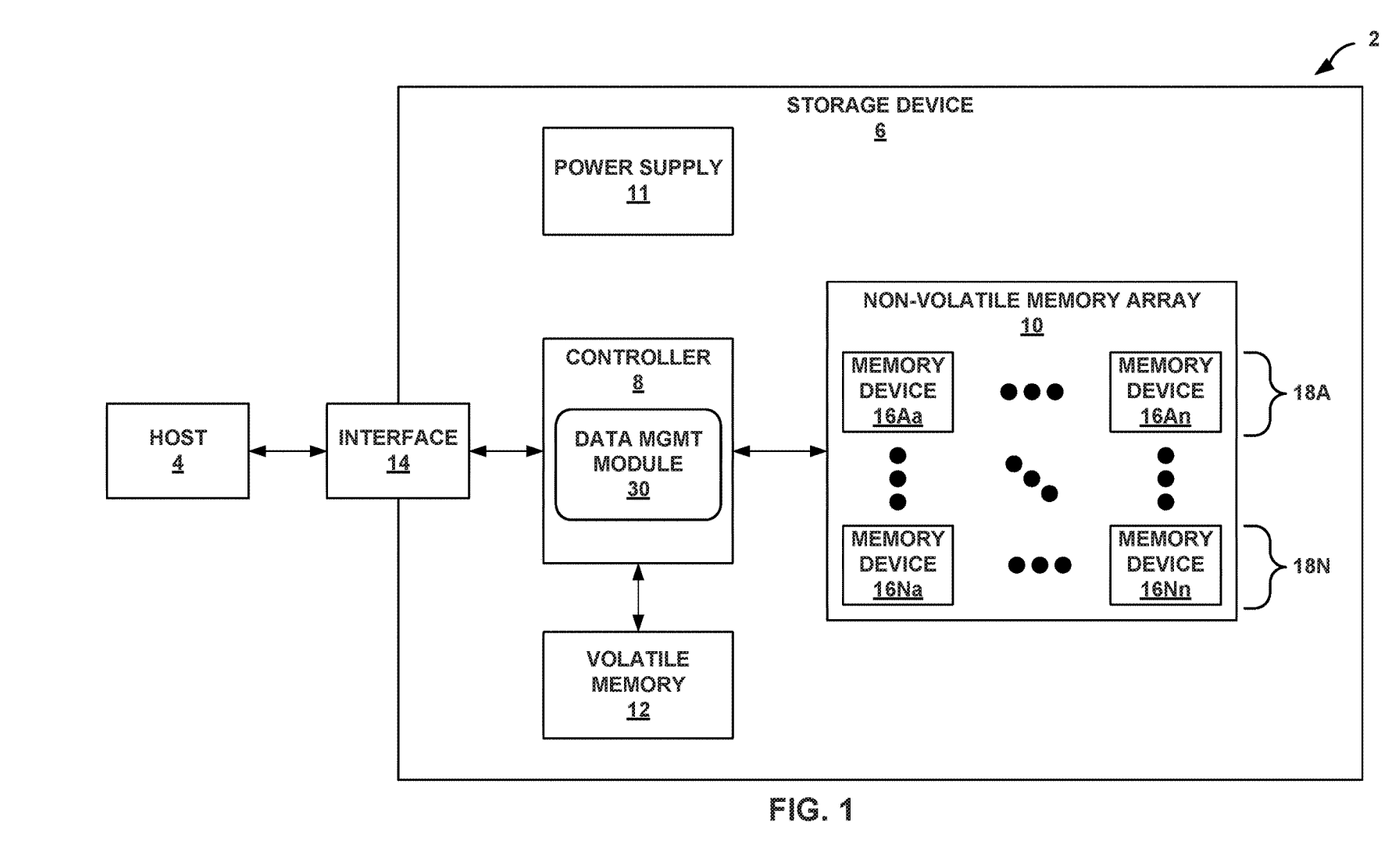
FIG. 1 is a conceptual and schematic block diagram illustrating an example storage environment in which a storage device may function as a storage device for a host device, in accordance with one or more techniques of this disclosure.

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, which may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store data to and/or retrieve data from one or more storage devices, such as storage device 6. As illustrated in FIG. 1, host device 4 may communicate with storage device 6 via interface 14. Host device 4 may include any of a wide range of devices, including CPU, GPU, computer motherboard, computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1, storage device 6 may include controller 8, non-volatile memory array 10 (NVMA 10), power supply 11, volatile memory 12, and interface 14. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6, or the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.), M.2, or the like. In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), PCI-express, Non-Volatile Memory Express (NVMe), or the like. The interface 14 (e.g., the data bus, the control bus, or both) is electrically connected to controller 8, providing communication channel between host device 4 and controller 8, allowing data to be exchanged between host device 4 and controller 8. In some examples, the electrical connection of interface 14 may also permit storage device 6 to receive power from host device 4.

Storage device 6 includes NVMA 10, which includes a plurality of memory devices 16Aa-16Nn (collectively, "memory devices 16"). Each of memory devices 16 may be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 16 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 16 may include any type of non-volatile memory (NVM) devices. Some examples of memory devices 16 include, but are not limited to flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

In some examples, memory devices 16 may include PCM devices. PCM devices may store data in the crystal structure of a metal alloy called a chalcogenide. In PCM devices, in some examples, may be divided into a plurality of words, and a respective word from each of a plurality of PCM memory devices may be grouped to form a page. Thus, a page may include a plurality of PCM cells physically located on different PCM devices. Controller 8 may write data to and read data from PCM devices at the page level. Thus, while controller 8 may read and write data at the page level, the words of a page may be the access unit of a memory device 16. In some examples, by dividing a page into a plurality of words located on different memory devices 16, controller 8 may improve throughput by reading from and writing to multiple memory devices 16 simultaneously. Additional details of memory devices 16 are discussed below with reference to FIG. 2.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16An may be grouped into first channel 18A, and memory devices 16Na-16Nn may be grouped into $N^{th}$ channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 18. In this way, the number of separate connections between controller 8 and memory devices 18 may be reduced. Additionally, as each channel has an independent set of connections to controller 8, the reduction in connections may not significantly affect the data throughput rate as controller 8 may simultaneously issue different commands to each channel.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like.

Storage device 6 also may include volatile memory 12, which may be used by controller 8 to store information. In some examples, controller 8 may use volatile memory 12 as a cache. For instance, controller 8 may store cached information in volatile memory 12 until the cached information is written to memory devices 16. Volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 6 includes controller 8, which may manage one or more operations of storage device 6. For instance, controller 8 may manage the reading of data from and/or the writing of data to memory devices 16. In some examples, controller 8 may perform one or more operations to manage data stored by memory devices 16. For instance, controller 8 may perform one or more operations to ensure the integrity of data stored by memory devices 16, such as storing parity data for user data stored by memory devices 16. Additional details of controller 8 are discussed below with reference to FIG. 3.

Controller 8 may include data management module (DMM) 30. DMM 30 may cause memory devices, or dies, 16 to store different types of data. For example, dies 16 may store user data, parity data, metadata, and/or redundancy data. In some examples, user data may include data received from host device 4. Parity data may include data used to detect and/or correct errors in the user data. For instance, parity data may include parity bits, checksum data, cyclic redundancy check (CRC) data, error correction code (ECC), or the like. Redundancy data may include data generated by performing an exclusive-or (XOR) function of other data, such as user data, parity data, or metadata. Metadata may include information about the user data. In some examples, metadata may include information about the reliability of the user data, also referred to as data reliability information. For example, data reliability information may include at least one of a cell error identifier, a page flip indicator, an access time-stamp, or a disturbance counter. In some examples, a cell error identifier may indicate a location of a particular bit that stores user data and is known to include an error. A page flip indicator may indicate whether the user data stored at a particular page was written as received from host device 4 or whether all of the bits stored at the particular page were flipped by controller 8. In some instances, a time-stamp may indicate a time when a page of user data was most recently accessed (e.g., written or read). A disturbance counter may indicate a number of times a page of user data has been read or a number of times the page of user data has been written.

In some examples, DMM 30 stores different types of data to different dies 16. For example, NVMA 10 may include a plurality of dies and DMM 30 may store user data, parity data, metadata, and/or redundancy data to one or more of the plurality of dies. In some examples, DMM 30 may store user data to a first subset (e.g., one die, two dies, or any number of dies less than the total number of dies) of the plurality of the dies, such that the first subset may be referred to as data dies. In some examples, DMM 30 may store parity data to a second subset (e.g., one die, two dies, or any number of dies less than the total number of dies) of the plurality of dies, where the second subset of dies do not include user data, such that the second subset of dies may be referred to as a parity die(s). For ease of illustration only, the disclosure describes the subset of dies that include parity data as a single die. However, in some examples, the subset of dies that include parity data may include a plurality of parity dies.

In other examples, DMM 30 may store combined user data and parity data to the data dies. For example, a data die may be used to store user and parity data. In some examples, DMM 30 may store remaining combined user and parity data to the parity die. For example, DMM 30 may store combined user data and parity data to the same word of the same die. In this way, user data and parity data may be stored at the same dies. In other words, in some examples, the user data and parity data is not necessarily stored on separate dies. For purposes and ease of illustration only, the description below describes user data and parity data as stored on separate dies.

DMM 30 may store parity data to respective words of the parity die, which are also referred to as parity words. Each parity word may store parity data corresponding to a respective page of user data. For instance, each parity word may store parity data (e.g., ECC data) to detect and correct errors in user data stored at a corresponding, respective data page. In some examples, a page of user data may be stored across multiple dies in units of a word, such that the portion of a page of user data stored at a particular die may be referred to as a data word. The size of the parity data may be based on the ECC strength. ECC strength may refer to the number of bit errors in user data associated with the parity data that controller 8 may detect and/or correct using parity data. As one example, if the ECC strength is 10 bits, controller 8 may be able to correct 10 bit errors in the user data, and may utilize 110 bits of parity data in order to correct the 10 bit errors in the user data. In some examples, a greater size of parity data may provide better protection against data corruption errors. However, as the size of the parity data increases, so does the amount of memory consumed by the parity data. For instance, if the ECC strength is 12 bits, controller 8 may be able to correct 12 bits errors in the user data, but may utilize 130 bits of parity data in order to correct the 12 bit errors in the user data.

In some examples, the size of the parity data may be less than the size of the particular parity word. For example, if the size of a particular parity word of the parity die is 128 bits and the size of the parity data utilized by the ECC strength is 110 bits, the particular parity word may include 18 extra bits that are unused.

In some examples, DMM 30 may store data to at least a portion of the unused bits of a particular parity word. For example, DMM 30 may store parity data to a first portion of a particular parity word and store metadata to a second portion of the particular parity word. In some examples, DMM 30 may determine a size of the first portion of the particular parity word based on the size of the parity data. In some examples, if a particular word of the parity die is 128 bits and the size of the parity data to be stored at the particular parity word is less than 128 bits (e.g., 100 bits), DMM 30 may determine the size of the first portion should be equal to the size of the parity data. In other examples, DMM 30 may determine the size of the first portion should be less than the size of the parity word but greater than the size of the parity data in order to leave extra bits available for increasing the ECC strength associated with user data associated with the particular parity word. In some examples, DMM 30 may determine a size of the second portion of the particular parity word based on the total size of the particular parity word and the size of the first portion of the particular parity word. For example, DMM 30 may determine the size of the second portion of the parity word based on the difference between the total size of the parity word and the size of the first portion of the parity word. For instance, if the total size of the parity word is 128 bits and the size of the first portion of the parity word is 118 bits, DMM 30 may determine that the size of the second portion of the parity word is 10 bits. In this way, DMM 30 may store metadata information (e.g., data reliability information) to the second portion of a particular word of a parity die, such that at least some of the bits that are not used for parity data may be used to improve the reliability of the user data stored on the data dies.

In this manner, DMM 30 may improve the reliability of the user data. In further contrast to some techniques for storing parity data which may store parity data to some bits of a particular parity word and may not use any of the remaining bits of the particular parity word, techniques of this disclosure may enable controller 8 to store metadata (e.g., data reliability information) to the bits that would otherwise go unused. As a result, the metadata may be used to increase the data reliability of the user data that is stored on the data dies. Thus, the described techniques may increase the reliability of the user data stored on the data dies.

Figure 2:
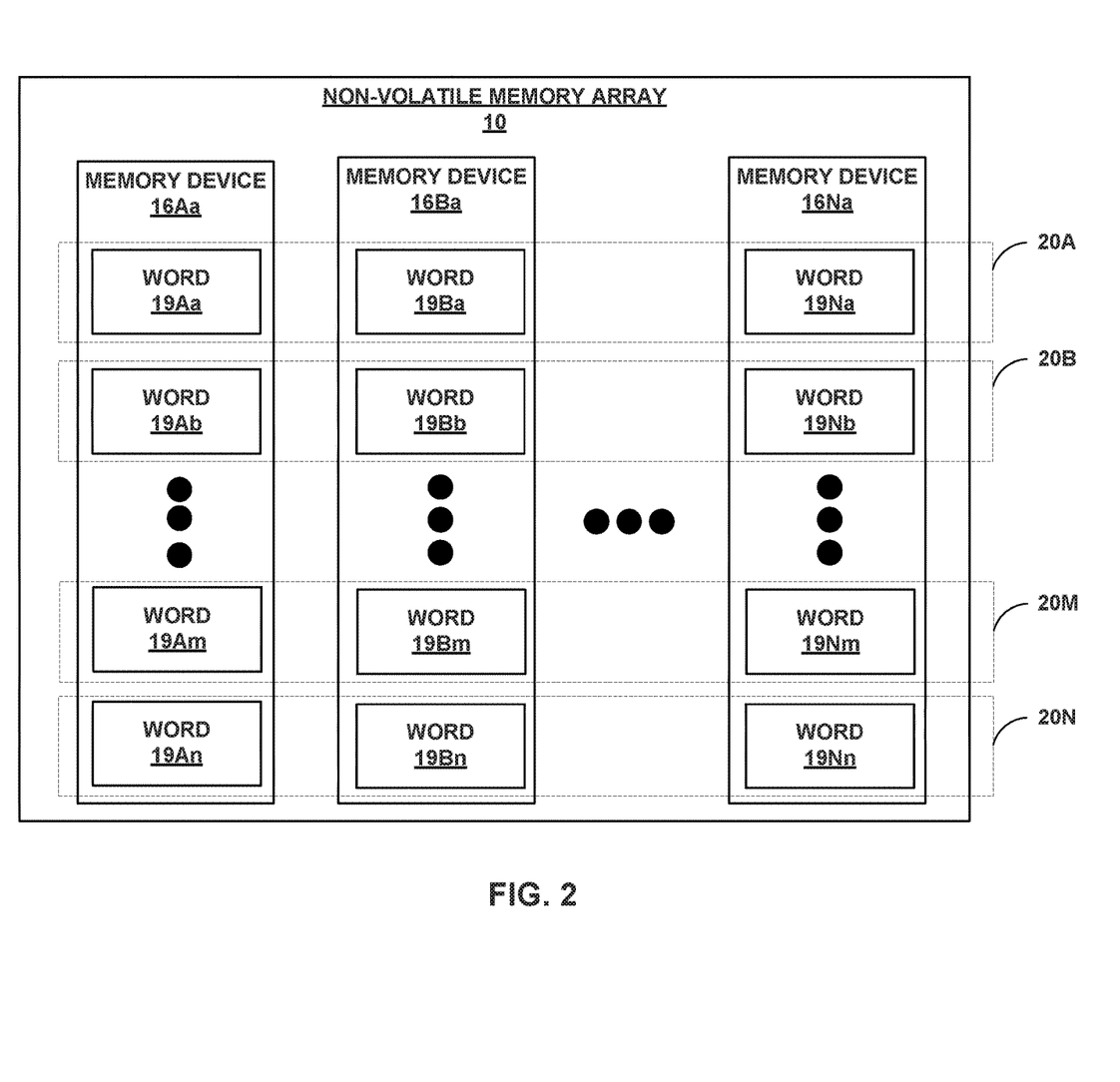
FIG. 2 is a conceptual block diagram illustrating an example memory array, in accordance with one or more techniques of this disclosure.

FIG. 2 is a conceptual block diagram illustrating an example non-volatile memory array 10 that includes a plurality of memory devices, or dies, 16. In some examples, each memory device 16 may be divided into a plurality of words 19Aa-19An (collectively, "words 19"). In some examples, pages 20A-20N (collectively, "pages 20) each include a respective word 19 from each of the plurality of memory devices 16.

Controller 8 may write data to and read data from memory devices 16 at the page level. Thus, a page 20 may the smallest unit that can be read or written by controller 8. However, because each page 20 may include a plurality of words 19 divided across a plurality of memory devices 16, the access unit for a particular memory device 16 may be a word 19.

Figure 3:
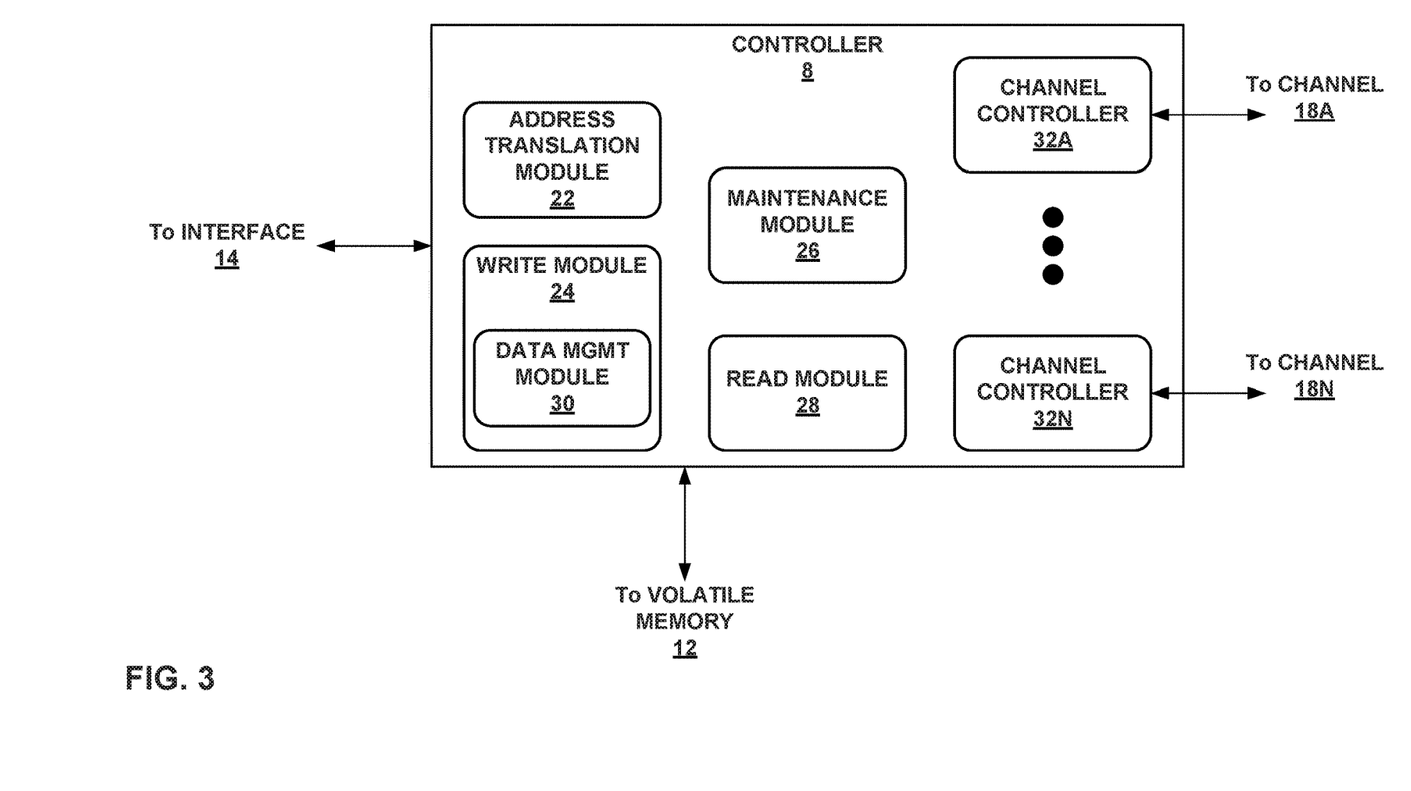
FIG. 3 is a conceptual and schematic block diagram illustrating an example controller, in accordance with one or more techniques of this disclosure.

FIG. 3 is a conceptual and schematic block diagram illustrating example details of controller 8. In some examples, controller 8 may include an address translation module 22, a write module 24, a maintenance module 26, a read module 28, a data management module 30, and a plurality of channel controllers 32A-32N (collectively, "channel controllers 32"). In other examples, controller 8 may include additional modules or hardware units, or may include fewer modules or hardware units. Controller 8 may include one or more microprocessor, digital signal processor (DSP), application specific integrated circuit (ASIC), field programmable gate array (FPGA), or other digital logic circuitry.

Controller 8 may interface with the host device 4 via interface 14 and manage the storage of data to and the retrieval of data from memory devices, or dies, 16. For example, write module 24 of controller 8 may manage writes to dies 16. For example, write module 24 may receive a message from host device 4 via interface 14 instructing storage device 6 to store data associated with a logical address and the data, which may be referred to as user data. Write module 24 may manage writing of the user data to dies 16.

For example, write module 24 may communicate with address translation module 22, which manages translation between logical addresses used by host device 4 to manage storage locations of data and physical block addresses used by write module 24 to direct writing of data to dies. Address translation module 22 of controller 8 may utilize an indirection table that translates logical addresses (or logical block addresses) of data stored by dies 16 to physical block addresses of data stored by dies 16. For example, host device 4 may utilize the logical block addresses of the data stored by dies 16 in instructions or messages to storage device 6, while write module 24 utilizes physical block addresses of the data to control writing of data to dies 16. (Similarly, read module 28 may utilize physical block addresses to control reading of data from dies 16.) The physical block addresses correspond to actual, physical blocks of dies 16. In some examples, address translation module 22 may store the indirection table in volatile memory 12 and periodically store a copy of the indirection table to dies 16.

In this way, host device 4 may be allowed to use a static logical block address for a certain set of data, while the physical block address at which the data is actually stored may change. Address translation module 22 may maintain the indirection table to map the logical block addresses to physical block addresses to allow use of the static logical block address by the host device 4 while the physical block address of the data may change, e.g., due to wear leveling, garbage collection, or the like.

As discussed above, write module 24 of controller 8 may perform one or more operations to manage the writing of data to dies 16. For example, write module 24 may manage the writing of data to dies 16 by selecting one or more blocks within dies 16 to store the data. As discussed above, write module 24 may cause address translation module 22 to update the table based on the selected blocks. For instance, write module 24 may receive a message from host device 4 that includes a unit of data and a logical block address, select a block within a particular die of dies 16 to store the data, cause the particular die of dies 16 to actually store the data (e.g., via a channel controller of channel controllers 32 that corresponds to the particular die), and cause address translation module 22 to update the table to indicate that the logical block address corresponds to the selected block within the particular die.

Read module 28 similarly may control reading of data from dies 16. For example, read module 28 may receive a message from host device 4 requesting data with an associated logical page address. Address translation module 22 may convert the logical page address to a physical page address using the table. Read module 28 then may control one or more of channel controllers 32 to retrieve the data from the physical page addresses. Similar to write module 24, read module 28 may select one or more pages and communicate a message to channel controllers 32 that may cause channel controllers 32 to read the data from the selected pages.

Responsive to receiving a write command from host device 4, write module 24 may determine at which physical locations of dies 16 to write the data. For example, write module 24 may request from address translation module 22 or maintenance module 26 one or more physical page addresses that are empty (e.g., store no data). Upon receiving the one or more physical page addresses, write module 24 may define and/or select one or more pages, and communicate a message to channel controllers 32A-32N (collectively, "channel controllers 32"), which causes the channel controllers 32 to write the data to the page(s).

Each channel controller of channel controllers 32 may be connected to a respective channel of channels 18. In some examples, controller 8 may include the same number of channel controllers 32 as the number of channels 18 of storage device 2. Channel controllers 32 may perform the intimate control of addressing, programming, erasing, and reading of dies 16 connected to respective channels, e.g., under control of write module 24, read module 28, and/or maintenance module 26.

Maintenance module 26 may be configured to perform operations related to maintaining performance and extending the useful life of storage device 6 (e.g., dies 16). For example, maintenance module 26 may implement at least one of wear leveling or garbage collection.

In some examples, write module 24 may include data management module (DMM) 30. DMM 30 may cause dies 16 to store different types of data, such as user data, parity data, metadata, and/or redundancy data. In some instances, DMM 30 may store multiple types of data on an individual die 16. In some instances, DMM 30 may store certain types of data on separate dies 16. For instance, DMM 30 may store user data to a first subset of the plurality of dies 16. Likewise, DMM 30 may store parity data to a second subset of the plurality of dies 16. The first subset of dies may be referred to as data dies and the second subset of dies may be referred to as parity dies. For example, if NVMA 10 includes nine dies, DMM 30 may store user data on eight of the dies (i.e., there are eight data dies) and may store parity data on one of the dies (i.e., there is one parity die). In other examples, NVMA 10 may include more or fewer dies and the ratio of data dies to parity dies may be different (e.g., 9 total dies, 7 data dies, and 2 parity dies; or 10 total dies, 8 data dies, 1 parity die, and 1 RAID die; or 12 total dies, 11 data dies, and 1 parity die; or any other number and combination of dies).

Figure 4:
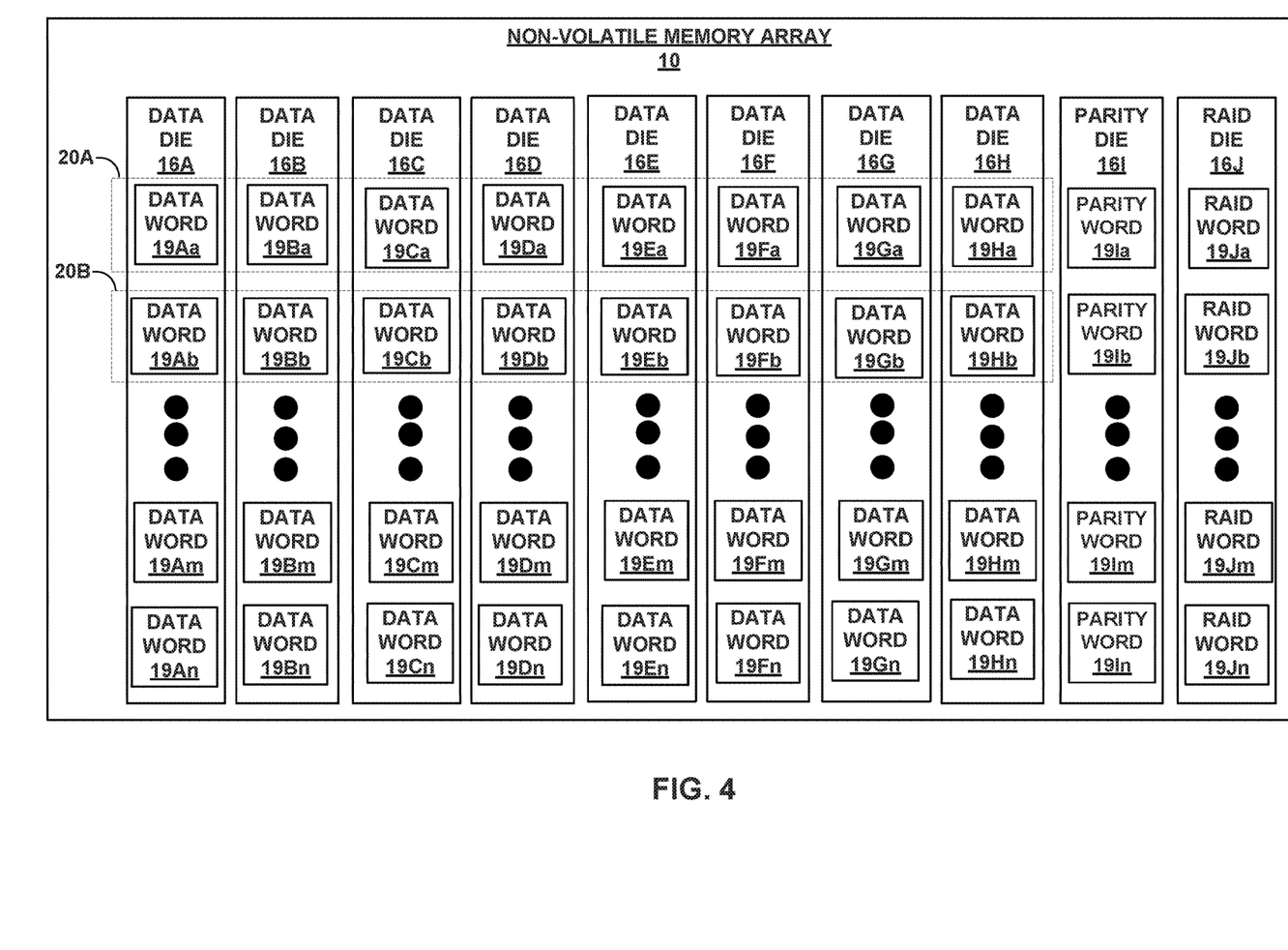
FIG. 4 is a conceptual block diagram illustrating an example memory array, in accordance with one or more techniques of this disclosure.

FIG. 4 is a conceptual block diagram illustrating an example memory array, in accordance with one or more techniques of this disclosure. For ease of illustration only, in, NVMA 10 is described as including 10 total dies, including eight data dies 16A-16H, one parity die 16I, and one RAID die 16J. However, as described above, the number of total dies and the distribution of data dies, parity dies, and RAID dies may be different.

Returning to FIG. 3, DMM 30 may be described with reference to NVMA 10 of FIG. 4. DMM 30 may store user data to the data dies 16A-16H. For example, DMM 30 may store a page of user data (e.g., page 20A) by dividing the page of user data into a plurality of words, also referred to as data words (e.g., data words 19Aa-19Ja, collectively referred to as data words 19), and storing one or more respective data words 19 of the page to each data die 16A-16H. For instance, a page may be 1024 bits and DMM 30 may divide the page of data into eight 128 bit data words, such that each of the eight data dies stores one of the eight data words. By storing the page of data across multiple dies, DMM 30 may store data to (or retrieve data from) multiple dies simultaneously, which may improve the throughput of storage device 6.

DMM 30 also may store parity data to the parity die 16I. The parity data may be used to detect and correct errors in the user data stored on the data dies 16A-16H. For example, a parity word (e.g., 19Ia) of the parity die 16I may store parity data associated with respective amounts (e.g., pages) of user data on the data dies 16A-16H. In other words, each parity word may store parity data used by controller 8 to detect and correct errors in corresponding user data.

In some examples, the parity data includes error correction code (ECC) data. The size of the parity data may be based on the ECC strength of the parity data. For example, if the ECC strength is 10 bits (e.g., controller 8 may be able to correct up to 10 bits of user data associated with the parity data), the parity data may utilize 100 bits of the parity word. Thus, if each parity word includes 128 bits and the ECC strength associated with a particular page of the of data dies is 10 bits, the parity data associated with a particular page of user data may utilize only 100 bits of the parity word. As a result, the parity word may include extra bits that are not utilized.

In some examples, the ECC strength may change over time as the reliability of the memory cells of dies 16 changes. The reliability of the memory cells of dies 16 may be quantified as a bit error rate (BER). In some examples, as the BER increases, controller 8 may increase the ECC strength and DMM 30 may store larger sizes of parity data to the parity words. As one example, where the BER associated with a page of user data is less than a threshold BER, DMM 30 may store less parity data associated with the page of user data than when the BER associated with the page of user data is greater than the threshold BER.

As the parity data may not consume a full parity word, DMM 30 may store parity data to a first portion of a parity word and may store metadata to a second portion of the parity word. In some examples, DMM 30 may determine the size of each portion of the parity word. In other examples, the size of each portion of the parity word may be predetermined. In some instances, the size of the first portion of a parity word may be based on the ECC strength. For instance, the size of the first portion may be equal to the size of the parity data. In other instances, the size of the first portion may be greater than the size of the parity data but less than the size of the particular parity word. In some examples, the size of the second portion may be based on the difference between the total size of the word and the size of the first portion. For example, if a parity word of the parity die includes 128 bits and the size of the first portion of the parity word is 100 bits, the size of the second portion of the parity word equals 28 bits. In some instances, DMM 30 may determine the size of the first portion of a first parity word that is different than the size of a first portion of a second parity word. In other words, some parity words may have a larger first portion that other parity words. For instance, as a data die ages (e.g., is written or read many times), controller 8 may increase the ECC strength associated with one or more pages of user data, such that DMM 30 may store additional parity data to a parity word corresponding to the user data.

In some examples, the metadata stored at the second portion of a parity word (e.g., parity word 19Ia) may include data reliability information, which may provide information about the reliability of the user data (e.g., page 20A) associated with the parity word 19Ia of the parity die 16I. For example, data reliability information may include at least one of as a cell error identifier, a page flip indicator, an access time-stamp, or a disturbance counter.

DMM 30 may store one or more cell error identifiers in the second portion of a parity word. A cell error identifier may indicate a location of a particular bit that stores user data and is known to include an error. For example, an ECC decoder may analyze a page of user data (e.g., page 20A) associated with the parity word (e.g., parity word 19Ia) and may compare the results of the analysis to the ECC data stored to the first portion of the parity word that corresponds to the page of user data. In some examples, the ECC decoder may be able to determine one or more bits which have an error and DMM 30 may store one or more cell error identifiers in the second portion of the parity word to indicate which bit or bits of user data are known to contain an error (e.g., a flipped bit). Controller 8 may utilize the one or more cell error identifier stored in the second portion of the parity word during later decoding of the user data to correct the one or more bits of user data known to contain an error. This may allow the ECC decoder to correct additional errors in the user data associated with the parity word above the ECC strength. For example, if the ECC data has a strength of four (i.e., can identify and correct up to 4 errors in the associated user data) and ECC identifies a bit containing an error and stores the cell error identifier in the second portion of the parity word, the ECC decoder may later be able to recover up to 5 errors in the associated user data, as the ECC decoder may utilize the cell error identifier to correct the error in the identified cell, and then may use the ECC data to correct the remaining 4 errors. In some examples, utilizing the one or more cell error identifiers may have a minimal effect on the performance overhead. For instance, the one or more cell error identifiers may be identified and updated in the background when controller 8 is not busy with other operations, such as read or write operations. In addition, the ECC decoder may utilize the one or more cell error identifiers without increasing the decoding complexity.

In some examples, DMM 30 may store a page flip indicator in the second portion of a parity word. A page flip indicator may indicate whether the user data stored at the page (e.g., page 20A) associated with the parity word (e.g., parity word 19Ia) was written as received from host device 4 or whether all of the bits stored at the particular page were flipped by controller 8. In some examples, write module 24 may be configured to flip all of the bits of a particular page when writing data received from host device 4.

In some examples, write module 24 may be configured to flip all of the bits of a particular page of user data based on the probability of a bit flip error and the user data received from host device 4. In some examples, an bit flip error may occur when read module 28 erroneously reads a bit that stores user data as a logical zero when the bit was written as a logical one (also referred to as a 1 to 0 error) or erroneously reads a bit as a logical one when the bit was written as a logical zero (also referred to as a 0 to 1 error). A bit flip error may occur if the state of a memory cell changes. For instance, controller 8 may determine the value of a bit by applying a read voltage a memory cell and determining whether current flows through the cell. Thus, a bit flip error may occur if the resistance of the cell changes, such that the read current may be changed making sensing error. If the probability of a 1 to 0 error is greater than the probability of a 0 to 1 error, and the user data to be stored at the page of the data dies includes more logical ones than logical zeros, write module 24 may be configured to flip the bits of the user data so that the written data includes more logical zeros than logical ones. Thus, DMM 30 may be configured to store a page flip indicator to the second portion of the parity word to indicate that the user data associated with the particular word of the parity die has been flipped by write module 24. For example, DMM 30 may store a logical one at the second portion of a parity word to indicate that the user data associated with the parity word has been flipped or a logical zero to at the second portion of a parity word to indicate that the user data associated with the parity word has not been flipped (or vice versa). In some examples, the probability of a bit flip error may be based on the type of memory device (e.g., flash, PCM, MRAM, ReRam, or the like) and/or the age (e.g., number reads/writes) of a particular page.

In some examples, write module 24 may be configured to flip all of the bits of a particular page of user data based on the read speed or write speed of a particular memory device rather than a probability of a bit flip error. For instance, controller 8 may be able to write or read a logical zero faster than writing or reading a logical one (or vice versa). If the speed of writing or reading a logical one is faster than the speed of writing or reading a logical zero, and the user data to be stored at the page of the data dies includes more zeros than ones, write module 24 may be configured to flip the bits of the user data to increase write and read performance. Thus, DMM 30 may be configured to store a page flip indicator to the second portion of the parity word to indicate that the user data associated with the parity word has been flipped by write module 24. For example, DMM 30 may store a logical one at the second portion of the parity word to indicate that the user data associated with the user data has been flipped or a logical zero at the second portion of the parity word to indicate that the user data associated with the parity word has not been flipped (or vice versa). In some examples, the write or read speed may be based on the type of memory device (e.g., flash, PCM, MRAM, ReRam, or the like) and/or the age (e.g., number reads/writes) of a particular page.

DMM 30 additionally or alternatively may store a time-stamp in the second portion of a parity word. The time-stamp may indicate when a page of user data (e.g., page 20A) associated with the parity word (e.g., parity word 19Ia) was most recently accessed (e.g., written or read). For example, if the ECC decoder detects a number of errors that is greater than the number of errors the ECC decoder can detect, controller 8 may adjust the read voltage based on the time-stamp of the corresponding parity word. For instance, if the time-stamp associated with a particular page of user data indicates that the page of user data was not written recently, this may indicate the cell resistance level of the page is changed such that controller 8 may need to adjust the reference read current when reading that page of user data. However, if the time-stamp associated with a page of user data indicates the page of user data was written recently, this may indicate the cell resistance level of the page is not changed such that controller 8 may not need to adjust the reference read current when reading that page of user data.

In some examples, DMM 30 may store one or more disturbance counters in the second portion of a parity word (e.g., parity word 19Ia). For example, DMM 30 may store a write disturbance counter to indicate the number of times a particular page of user data (e.g., page 20A) associated with the write disturbance counter has been written, a read disturbance counter to indicate the number of times a particular page of user data associated with the read disturbance counter has been read, or both. Because the controller applies a voltage to a memory device to write or read data, writing data to or reading data from a bit that stores user data may disturb the surrounding bits of user data, which may cause an inadvertent bit flip of the surrounding bits of user data. Controller 8 may be configured refresh adjacent cells after a certain number of writes or reads in order to avoid failure caused by the number of inadvertent bit flips.

In some examples, DMM 30 may update the one or more disturbance counters stored at the second portion of a parity word each time the corresponding page of user data is written or read. For example, DMM 30 may increment (e.g., increase by one) the value of the disturbance counter after each read or write. However, updating the one or more disturbance counters each time the corresponding page of user data is written or read may reduce performance by adding to the write/read latency overhead.

In some examples, DMM 30 may update the one or more disturbance counters less frequently than after every read or write. For example, DMM 30 may generate a random number each time user data is written or read and may update the one or more disturbance counters only when the value of the random number generator is equal to a predefined target value. For instance, the random number generator may randomly generate a value within a predefined range (e.g., between 0 and 99 for each write or between 0 and 9,999 for each read) such that DMM 30 may update the value of the disturbance counter with a frequency that is proportional to the number of values in the predefined range. If, for example, the predefined range for writes is 0 to 99, the value of the random number generator should equal the predefined target value, on average, one out of every after 100 writes. In this way, DMM 30 may increment the value of the write disturbance counter, on average, once every 100 writes. Similarly, if the predefined range for reads is between 0 and 9,999, the value of the random number generator should equal the predefined target value, on average, once every 10,000 reads. In this way, DMIVI 30 may update the value of the read disturbance counter, on average, after 10,000 reads. In some examples, the second portion of a word of a parity die may include a single disturbance counter. DMM 30 may update the value of the disturbance counter only for writes, only for reads, or for both reads and writes.

Controller 30 may compare the value of the disturbance counter to a threshold disturbance count value (e.g., 100, 250, or any other value). Responsive to determining that the value of the one or more disturbance counters is equal to or greater than a threshold disturbance count value, write module 24 may refresh adjacent cells of the particular page corresponding to the disturbance counter by reading and re-writing.

In some examples, NVMA 10 may include a RAID die 16J. The RAID die 16J may store redundancy data to make it possible to reproduce either the user data stored on a data die or the parity and metadata stored on a parity die, should any of the data dies 16A-16H or parity die 16I fail. Controller 8 may generate redundancy data by performing an exclusive-OR (XOR) function of the data stored on the data dies 16A-16H and the data stored on the parity die 16I. Write module 24 may store the redundancy data to the RAID die 16J.

In some examples, in order to improve the reliability of the redundancy data, controller 8 may attempt to verify the user data stored at the data dies 16A-16H and the parity data stored at the parity die 16I prior to storing the redundancy data on the RAID die 16J. In other words, controller 8 may attempt to make sure the inputs to the XOR function are correct before determining the redundancy data. For example, controller 8 may utilize an error correction algorithm to analyze the user data stored at the words of a particular page and may compare the results of the analysis to the corresponding parity data stored at the first portion of the associated parity word. While the user data and the corresponding parity data stored at the first portion of the associated word of the parity die may be used to determine if there are errors in either the user data or the parity data, the metadata stored in the second portion of the word associated with a particular page may not be protected by external parity information.

DMM 30 may store metadata stored to a second portion of a parity word so that the metadata is self-correctible. For example, DMM 30 may store the metadata using a repetition code. In other words, by storing the metadata using a repetition code, the metadata may be self-correctible so as to not affect the XOR function used to generate the redundancy data. For example, if the metadata stored at the portion of the parity word includes two bits "10", DMM 30 may use a repetition code to repeat the metadata a certain number of times. For instance, DMM 30 may repeat the metadata four times such that the second portion of the parity word may store eight bits as "11110000". In this way, if read module 28 reads the second portion of the parity word as "10110000", controller 8 may determine that the second bit has an error and may correct the bit. While the example above illustrates a repetition code that repeats each bit four times, it will be understood that controller 8 may repeat the metadata more than or fewer than four times.

In some examples, controller 8 may determine the number of times to repeat the metadata based on the raw bit error rate (RBER) of a memory device and the target unrecoverable bit error rate (UBER). The RBER may include the probability of a bit error before utilizing an ECC algorithm. The target UBER may include a desired percentage of errors that cannot be corrected after utilizing an ECC algorithm. In some examples, if RBER=$10^{-5}$ and the target UBER=$10^{-18}$, DMM 30 may determine that the number of repetitions should equal eight in order to reduce the risk of an uncorrectable bit error below the target UBER. In other words, DMM 30 may utilize 8 bits of the second portion of the parity word to store 1 bit of metadata, 16 bits of the second portion of the parity word to store 2 bits of metadata, and so on. In some examples, if the parity data stored at the first portion of a parity word utilizes 100 bits of a 128 bit word, the second portion of the parity word may utilize 28 bits. Thus, if the metadata will be repeated eight times to achieve the target UBER and the second portion of the parity bit includes 28 bits, DMM 30 may store 3 unique bits of metadata to the second portion of the parity word. In other words, the 3 unique bit values may be repeated eight times each, which will utilize 24 of the 28 available bits in the second portion of the parity word. In this way, controller 8 may determine whether there are any errors in the metadata and correct the errors before performing an XOR function of the data stored on the data dies and the data stored on the parity die.

Figure 5:
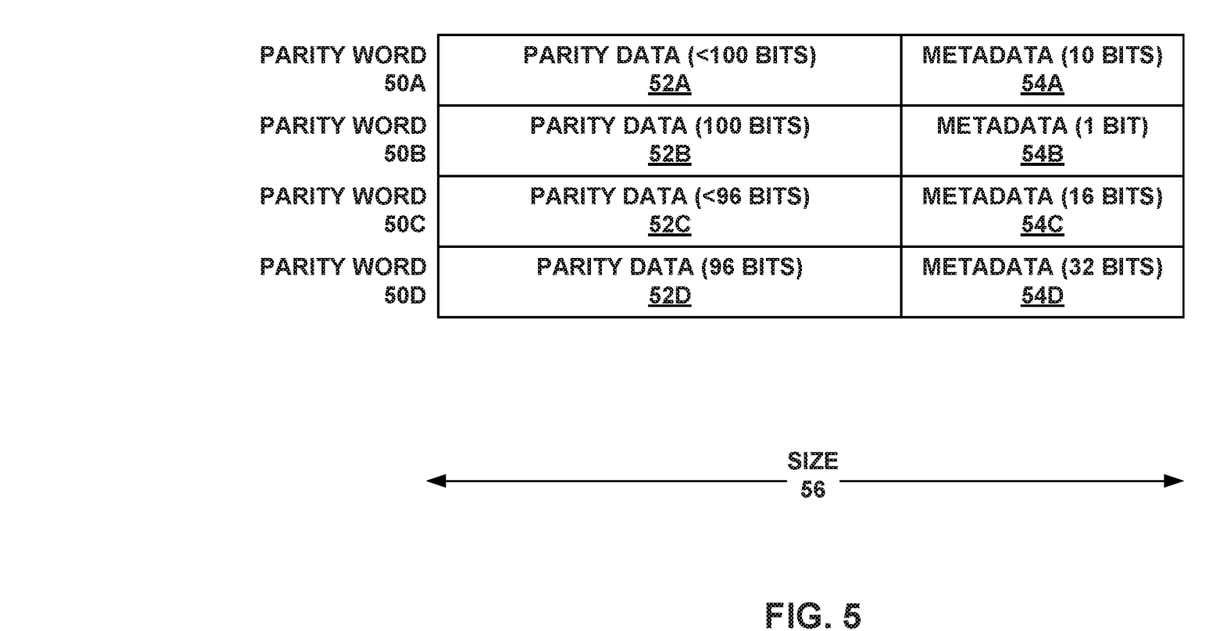
FIG. 5 is a conceptual block diagram illustrating example configurations of parity data and metadata stored at a parity die, in accordance with one or more techniques of this disclosure.

FIG. 5 is a conceptual diagram illustrating an example logical configuration of a parity word of a parity die, where the parity word includes multiple portions. In some examples, a first portion of a parity word may include parity data associated with user data of a corresponding page of user data, and a second portion of the parity word may include metadata associated with the user data of the corresponding page of user data. For example, the second portion may store metadata such as data reliability information (e.g., a cell error identifier, a page flip indicator, a time-stamp, or a disturbance counter). In some examples, all of the bits of a particular parity word may be used by the first portion and the second portion. However, in some examples, some bits of a particular parity word may be unused. In other words, the total size of the parity word may be greater than the sum of the size of the first portion and the size of the second portion.

As illustrated in FIG. 5, the size of parity word 50A may be 128 bits, the size of first portion 52A may be less than 100 bits, and the size of second portion 54A may be 10 bits (e.g., if the metadata includes a cell error identifier). Similarly, the size of parity word 50B may be 128 bits, the size of first portion 52B may be 100 bits, and the size of second portion 54B may be 1 bit (e.g., if the metadata includes a page flip indicator). In some examples, the size of parity word 50C may be 128 bits, the size of first portion 52C may be less than 96 bits, and the size of second portion 54C may be 16 bits (e.g., if the metadata includes a time-stamp. Likewise, the size of parity word 50D may be 128 bits, the size of first portion 52D may be 96 bits, and the size of second portion 54D may be 32 bits (e.g., if the metadata includes a disturbance counter). While the total size of the parity words is described as 128 bits, the total size of the parity words may include more or fewer bits. Similarly, the sizes of first portion and the sizes of the second portion of the parity words may be any number of bits less than or equal to the total size of the parity word, and is not limited to the sizes described above.

Figure 6:
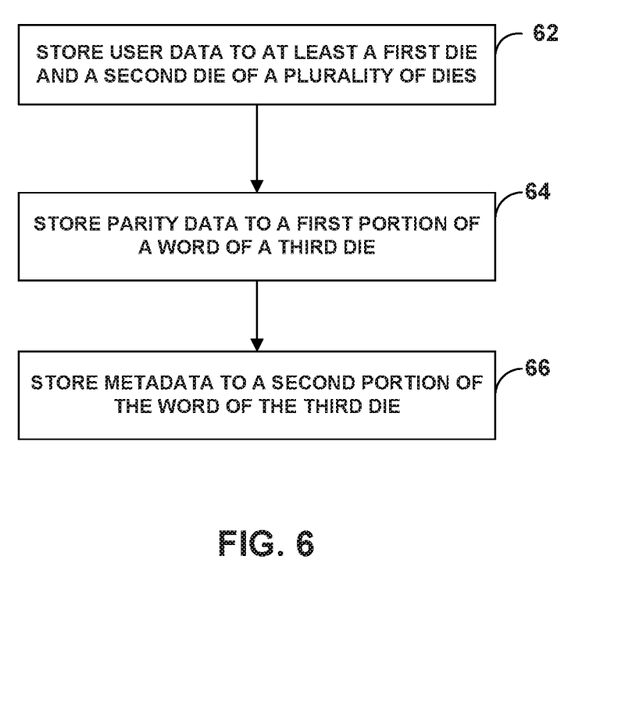
FIG. 6 is a flow diagram illustrating an example technique for storing parity data and metadata to a parity die, in accordance with one or more techniques of this disclosure.

FIG. 6 is a flow diagram illustrating an example technique for storing parity data and metadata to a parity die, in accordance with one or more techniques of this disclosure. For ease of illustration, the exemplary technique of FIG. 6 will be described with concurrent reference to storage device 6 and controller 8 of FIGS. 1 and 3. However, the techniques may be used with any combination of hardware or software.

Controller 8 may receive a write command including user data from host device 4. Responsive to receiving the write command, DMM 30 may store the user data to at least a first die and a second die plurality of data dies (62). For example, DMM 30 may write the user data to at least a first die and a second die of the plurality of dies, in units of a page. In some examples, each page may be divided among the plurality of dies. For example, if a page includes 1 kilobit (e.g., 1024 bits) and storage device 6 include eight dies, the page may be divided into eight 128 bit words, such that the access level for a particular dies is a single word.

DMM 30 may store parity data to a first portion of a word of a third die (64) and may store metadata to a second portion of the word of the third die (66). The word of the third die may also be referred to as a parity word. In some examples, the size of the first portion of the parity word and the size of the second portion of the parity word may be predetermined. In other examples, DMM 30 may determine the size of the first portion of the parity word based on the ECC strength associated with the user data associated with the parity word. For example, if the ECC strength associated with the user data enables controller 8 to detect and/or correct up to 10 bits while utilizing 100 bits of parity data, DMM 30 may determine that the size of the first portion of the parity word should be 100 bits. DMM 30 may determine the size of the second portion of the parity word based on the difference between the total size of the parity word and size of the first portion of the parity word.

Figure 7:
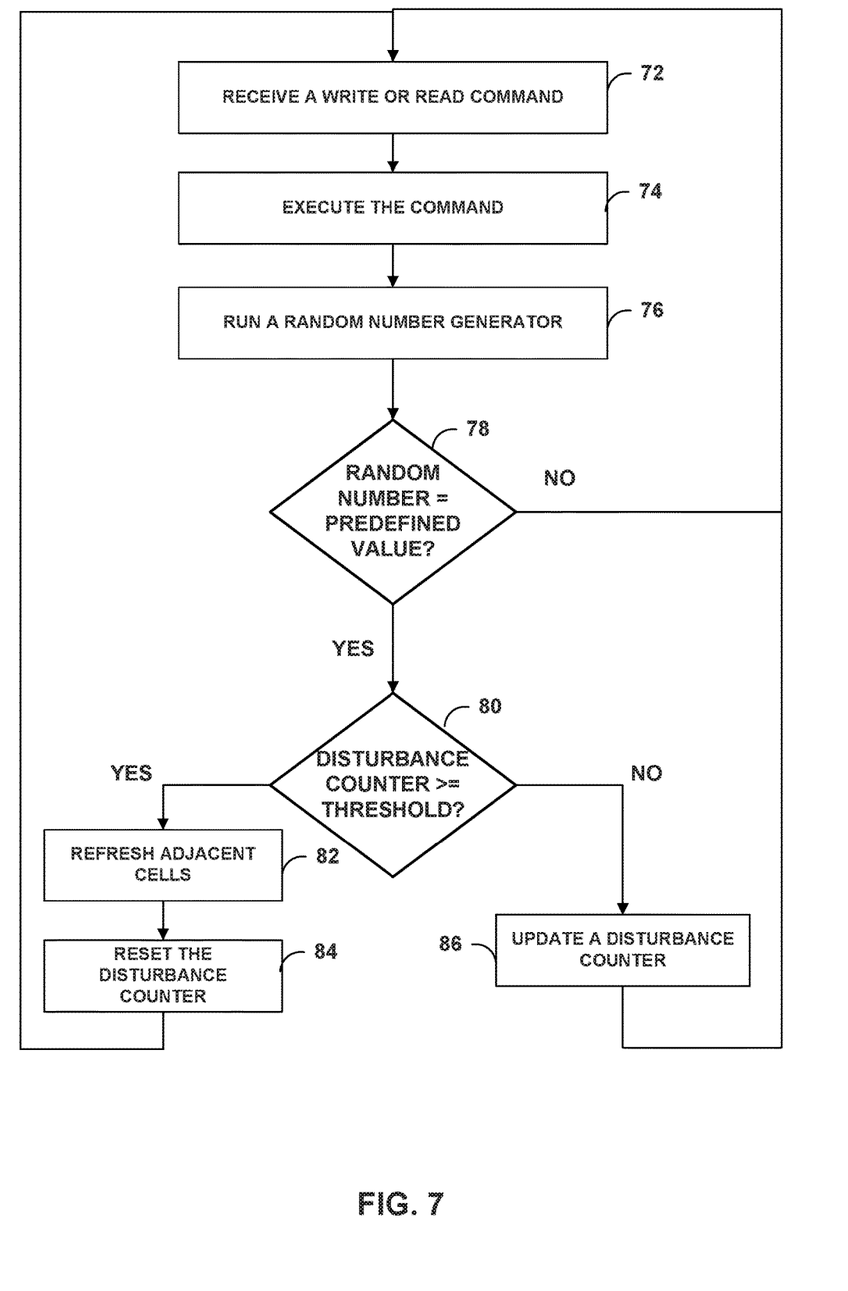
FIG. 7 is a flow diagram illustrating an example technique for storing metadata to a parity die, in accordance with one or more techniques of this disclosure.

FIG. 7 is a flow diagram illustrating an example technique for storing metadata to a parity die, in accordance with one or more techniques of this disclosure. For ease of illustration, the exemplary technique of FIG. 7 will be described with concurrent reference to storage device 6 and controller 8 of FIGS. 1 and 3. However, the techniques may be used with any combination of hardware or software.

Controller 8 may receive a write command or a read command from host device 4 (72). Responsive to receiving the command, controller 8 may execute the command (74). For example, if the received command is a write command, DMM 30 may write the received user data to one or more pages of a plurality of data dies. In some examples, DMM 30 may write a page of user data across separate data dies, for example, by dividing each page into a plurality of words and writing a word of user data to each of the data dies. DMM 30 store parity data associated with each page of user data to a first portion of a corresponding word of a parity die. In some examples, DMM 30 may store data reliability information associated with the user data, such as a disturbance counter, to a second portion of the word of the parity die. In some examples, if the received command is a read command, read module 28 may retrieve user data from one or more data dies and controller 8 may send the user data to host device 4.

Responsive to controller 8 receiving a command from host device 4, controller 8 may determine whether to update a disturbance counter associated with the page of user data that was written or read as a result of the command received from host device 4. In some examples, controller 8 may determine whether to update the disturbance counter by generating a random value and comparing the random number to a predefined value.

Controller 8 may generate a random value by running a random number generator (76). For example, if the received command is a write command, controller 8 may run a random number generator to generate a value between 0 and 99. In another example, if the received command is a read command, controller 8 may run a random number generator to generate a value between 0 and 9,999. Responsive to running the random number generator, controller 8 may determine whether the value generated by the random number generator is equal to a predefined value (78) by comparing the random number to a predefined value.

In some examples, if controller 8 determines that the value generated by the random number generator is equal to a predefined value, controller 8 may determine whether the value stored by a disturbance counter is greater than or equal to a threshold disturbance value (80). If the value of the disturbance counter is less than the threshold disturbance counter, controller 8 may update the disturbance counter (86) and wait for another command from host device 4. In other examples, if controller 8 determines that the value generated by the random number generator is equal to a predefined value, controller 8 may first update a disturbance counter and then determine whether the value of the disturbance counter determine whether the value of the disturbance counter is greater or equal to a threshold disturbance value.

Responsive to controller 8 determining that the value of the disturbance counter is greater than or equal to a threshold disturbance value, DMM 30 may refresh adjacent cells of a page associated with the disturbance counter (84). For example, DMM 30 may read and write the adjacent cells of the page associated with the disturbance counter. Responsive to refreshing associated with the disturbance counter, DMM 30 may reset the disturbance counter to a baseline disturbance count value (84).

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage medium.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A data storage device comprising:
a non-volatile memory array comprising a plurality of dies, wherein each die of the plurality of dies includes a plurality of words; and
a controller coupled to the non-volatile memory array, the controller includes a writes module including a data management module, and address translation module, a read module, and a maintenance module, wherein the controller is configured to:
store user data to of at least a first die and a second die of the plurality of dies;
store parity data to a first portion of a third die of the plurality of dies; and
store metadata to a second portion of the third die, wherein the metadata stored to the second portion of the third die is self-correctable, the non-volatile memory array further comprises a RAID die associated with the plurality dies, wherein the controller is further configured to:
detect errors using parity data in the self-correctable metadata stored to the second portion of the third die;
responsive to detecting errors in the self-correctable metadata, correct the errors using parity data in the self-correctable metadata stored to the second portion the third die;
generate redundancy data by performing an XOR operation of the third die, the first die, and second die; and
store, to the RAID die, the redundancy data.

2. The data storage device of claim 1, wherein:
a size of the first portion of the third die is based on an ECC strength associated with the parity data stored at the third die; and
a size of the second portion of the third die is based on a difference between a total size of the third die and the size of the first portion of the third die.

3. The data storage device of claim 2, wherein:
the size of the first portion of the third die is different than the size of the second portion of the third die.

4. The data storage device of claim 1, wherein the metadata includes a cell error identifier that indicates a location of a particular bit of the at least first die and second die that includes an error.

5. The data storage device of claim 1, wherein the metadata includes a page flip indicator that indicates whether user data was flipped by the controller prior to writing the user data to the at least first die and second die.

6. The data storage device of claim 1, wherein the metadata includes a time-stamp that indicates a time when at least the first die and second die were most recently accessed.

7. The data storage device of claim 1, wherein the metadata includes a disturbance counter that indicates a number of times the at least first die and second die have been read or a number of times the at least first die and second die have been written.

8. The data storage device of claim 1, wherein the controller is further configured to store user data to the first portion of the third die.

9. A method comprising:
storing, by a controller, user data to a first die and a second die of a plurality of dies of a non-volatile memory array;
storing, by the controller, parity data to a first portion of a third die of the plurality of dies; and
storing metadata to a second portion of the third die, wherein the metadata stored to the second portion of the third die is self-correctable, the memory array further comprises a RAID die associated with the plurality of dies, the method further comprising:
detecting, by the controller, errors in the self-correctable metadata stored to the second portion of the third die;

responsive to detecting errors in the self-correctable metadata, correcting, by the controller, the errors in the self-correctable metadata stored to the second portion of the third die;

generating, by the controller, redundancy data by performing an XOR operation of the third die and from at least the first die and second die; and storing, the redundancy data.

10. The method of claim 9, wherein:

a size of the first portion of the third die is based on an ECC strength associated with the parity data stored at the third die; and a size of the second portion of the third die is based on a difference between a total size of the third die and the size of the first portion of the third die.

11. The method of claim 10, wherein:

the size of the first portion of the third die is different than the size of the second portion of the third die.

12. The method of claim 9, wherein the metadata includes a cell error identifier that indicates a location of a particular bit of the at least first die and second die of the plurality of dies that includes an error.

13. The method of claim 9, wherein the metadata includes a page flip indicator that indicates whether user data was flipped by the controller when the user data was written to the at least first die and second die.

14. The method of claim 9, wherein the metadata includes a time-stamp that indicates a time when the first die and second die were most recently accessed.

15. The method of claim 9, wherein the metadata includes a disturbance counter that indicates a number of times the first die and second die have been read or a number of times the first die and second die have been written.

16. A non-transitory computer-readable storage medium storing instructions that, when executed, cause a controller of a data storage device to:

store user data to a first die and a second die of a plurality of data dies of a non-volatile memory array;

store parity data to a first portion of a third die of the plurality of dies; and store metadata to a second portion of the third die, wherein the metadata stored to the second portion of the third die is self-correctable, the non-volatile memory array further comprises a RAID die associated with the plurality of dies, the data storage device further comprising instructions that, when executed, cause the controller to:

detect errors in the self-correctable metadata stored to the second portion of the third die;

responsive to detecting errors in the self-correctable metadata, correct the errors in the self-correctable metadata stored to the second portion of the third die;

generate redundancy data by performing an XOR operation of the third die, the first die, and second die; and store, to the RAID die, the redundancy data.

17. The non-transitory computer-readable storage medium of claim 16, wherein:

a size of the first portion of the third die is based on an ECC strength associated with the parity data stored at the third die; and a size of the second portion of the third die is based on a difference between a total size of the third die and the size of the first portion of the third die.

* * * * *